(12) United States Patent
Ryu et al.

(10) Patent No.: US 6,888,242 B2
(45) Date of Patent: May 3, 2005

(54) COLOR CONTACTS FOR A SEMICONDUCTOR PACKAGE

(75) Inventors: Sang Hyun Ryu, Seoul (KR); Chan Yeok Park, Seoul (KR); Ji Young Chung, Kyounggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/437,749

(22) Filed: May 14, 2003

(65) Prior Publication Data

US 2003/0219927 A1 Nov. 27, 2003

(30) Foreign Application Priority Data

May 15, 2002 (KR) ................................ 10-2002-0026779
May 15, 2002 (KR) ................................ 10-2002-0026778

(51) Int. Cl.[7] .............................................. H01L 23/04
(52) U.S. Cl. ....................... 257/730; 257/779; 257/780; 438/646; 438/647; 438/648
(58) Field of Search ...................... 257/738, 779–780; 228/33, 41, 262; 428/646–648

(56) References Cited

U.S. PATENT DOCUMENTS 6,312,498 B1  11/2001  Lee et al.
6,517,602 B2   2/2003  Sato et al.
6,540,129 B2   4/2003  Lee
6,805,914 B2 * 10/2004  Clark et al. .................. 427/387

* cited by examiner

*Primary Examiner*—Dung A. Le
(74) *Attorney, Agent, or Firm*—Weiss, Moy & Harris, P.C.

(57) ABSTRACT

The surface of a solder ball and a conductive wire for a semiconductor package are coated with a predetermined colorant. Various colorants may be used according to the diameter and metal composition of the solder ball and the conductive wire. The colorant is formed by mixing organic compound and dye of a predetermined color. Examples of organic compounds excellent in physicochemical bonding with metal include benzotriazole, alkylimidazole and benzimidazole. The solder ball is fabricated by coating an organic compound of a predetermined color on the surface of a typical solder ball. The conductive wire is fabricated by coating an organic compound of a predetermined color on a general conductive wire between heat process and winding. Moreover, the solder ball is evaporated in a reflowing step after bumped via flux and the conductive wire is evaporated in a wire bonding step so that the solder ball and the conductive wire return to their unique colors.

16 Claims, 9 Drawing Sheets

COLOR CONTACTS FOR A SEMICONDUCTOR PACKAGE

BACKGROUND OF THE INVENTION

1. Field of the Invention

This invention relates to semiconductor packages, and, more specifically, to solder balls and conductive wires for a semiconductor package, and an improved manufacturing method and evaporation method therefor.

2. Description of the Related Art

In general, solder balls for semiconductor packages are made of an alloy containing Sn, Pb, Ag and the like. Solder balls are widely used as input/output terminals for connecting the semiconductor package to external devices. Since the solder balls are readily fabricated and processed, their melting points are relatively low. In particular, solder balls are mainly in the form of input/output terminals arrayed on one side of the semiconductor package such as BGA, PBGA and so on.

Such solder balls can have various sizes and metal components according to the size, use and type of semiconductor packages and the taste of the customers. As recent regulations have been intensified against environmental pollution, lead-free solder balls made of only Sn also have become developed and commercialized.

The solder balls used in a semiconductor package are diverse in their types (size and metallic composition). In general, one fabrication process frequently uses several types of solder balls.

For example, because one ball bumping apparatus uses several kinds of semiconductor packages and several types of solder balls, management of the solder balls is more difficult. Management might be more or less easy if various types of solder balls could be managed by their respective ball bumping apparatuses. However, since the ball bumping apparatuses are restricted in number owing to their high price, only a few ball bumping apparatuses are used to perform solder bumping for various types of solder balls. This further increases the risk of mixing among different solder balls.

When the solder balls of different sizes and metallic compositions are mixed, the solder balls may not be tightly fixed via reflow process or may be fused with different diameters. This may cause various sequential problems in that the solder balls may not be electrically connected to external devices.

A conductive wire for a semiconductor package is generally a thin line which is made of Au, Al or Cu, and serves to connect a semiconductor die and a substrate (e.g., a lead frame, a printed circuit board, a circuit film, a circuit tape and so on). That is, the thin conductive wire is one of the structural materials of the semiconductor package, which electrically connects between the semiconductor die and the substrate for supporting the semiconductor die.

The diameter, metal, and composition of the conductive wire can be diversified according to the type and physical/mechanical characteristic of semiconductor packages or the taste of customers. In recent days, copper wires have been developed and commercialized that are more excellent in physical/electrical performance.

During the manufacturing process, a label is attached on a spool container in order to identify the conductive wire contained in the container. However, since the conductive wire is taken out of the container during wire bonding of the semiconductor package, it is difficult to thereafter identify the type or diameter of the conductive wire. As the conductive wires used in semiconductor packages are recently diversified in their types (diameter and metal), it is more difficult to discriminate a specific conductive wire from others if various types of conductive wires are used in the same fabrication process.

For example, one wire bonding apparatus uses several kinds of semiconductor packages and several types of conductive wires. Management of the conductive wires becomes more difficult because of the different types of wire that is used. Management might be more or less easy if various types of conductive wires could be managed by their respective wire bonding apparatuses. However, since the wire bonding apparatuses are restricted in number owing to their high price, only a few wire bonding apparatuses are used for wire bonding of various types of conductive wires. This further increases the risk of mixing among different conductive wires.

If the conductive wires of different diameters and metals are erroneously used, many problems are created in that the conductive wires are not tightly bonded to a semiconductor die or substrate, or in that mechanical, chemical or electrical characteristics may not be obtained at desired values.

Therefore a need existed to provide a semiconductor package and a method of producing a semiconductor package that overcomes the above problems.

BRIEF SUMMARY OF THE INVENTION

The surface of a solder ball and a conductive wire for a semiconductor package are coated with a predetermined colorant. Different colorants are used according to the diameter and metal composition of the solder ball and the conductive wire. The colorant is formed by mixing organic compound and dye of a predetermined color. The solder ball is fabricated by coating an organic compound of a predetermined color on the surface of a typical solder ball. The conductive wire is fabricated by coating an organic compound of a predetermined color on a general conductive wire between heat process and winding. Moreover, the solder ball is evaporated in a reflowing step after bumped via flux and the conductive wire is evaporated in a wire bonding step so that the solder ball and the conductive wire return to their unique colors.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION OF THE INVENTION

Figure 1:
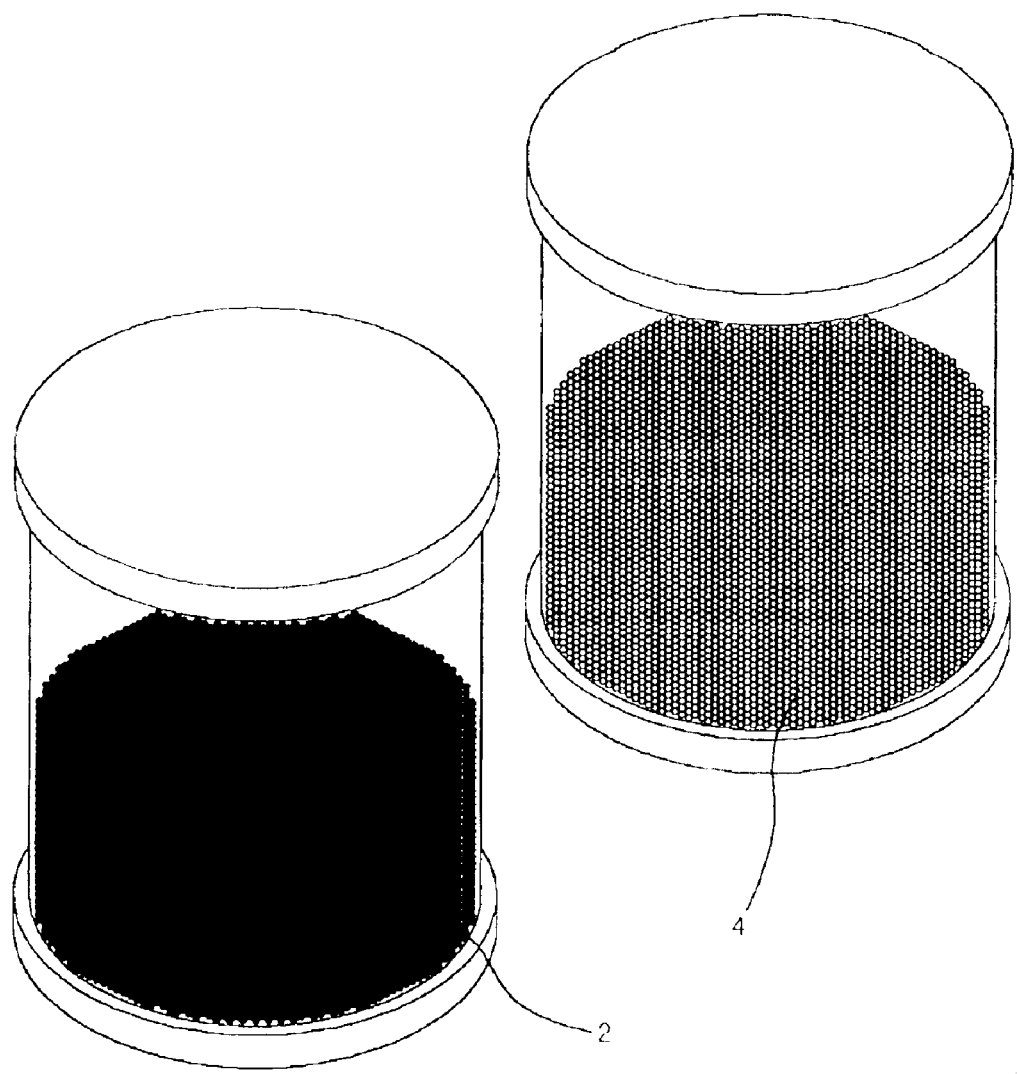
FIG. 1 shows solder balls of the present invention contained in a glass bottle and conventional solder balls contained in another glass bottle.
Figure 2:
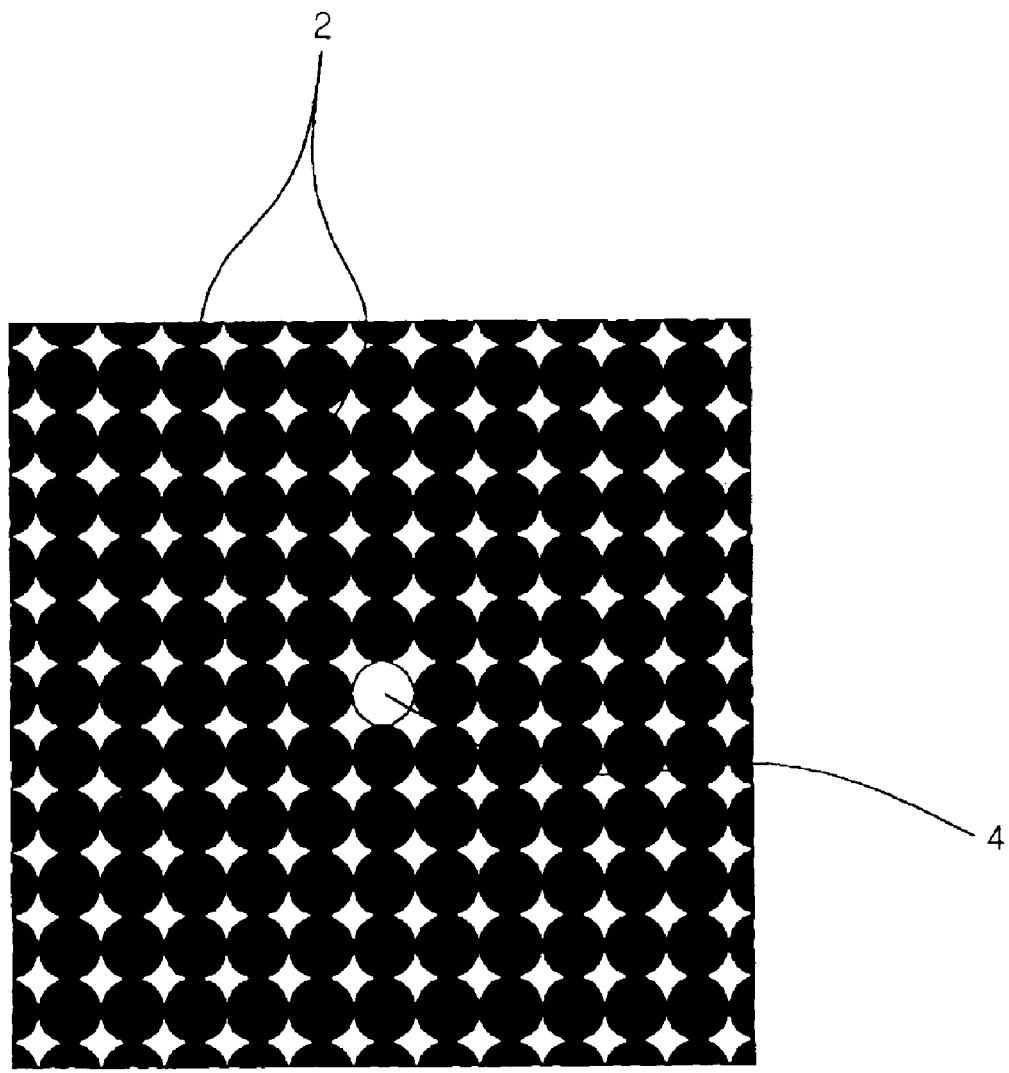
FIG. 2 shows solder balls of the present invention mixed with conventional solder balls.

Referring to FIG. 1, solder balls 2 of the present invention are contained in a glass bottle, and conventional solder balls 4 are contained in another glass bottle. Referring to FIG. 2, the conventional solder balls 4 are mixed into the. solder balls 2 of the present invention.

As shown in drawings, the solder balls 2 of the present invention have a substantially global outer shape, and the surface of the solder balls 2 is characteristically dyed with a predetermined color. The solder balls 2 are bumped on a semiconductor package substrate via flux and then reflowed at high temperature to be used as input/output terminals.

Although not shown in drawings, conductive wires of the present invention are fine conductors and their surface is characteristically dyed with a predetermined color. Of course, the conductive wires are used to electrically interconnect a semiconductor die with a substrate.

Colorant is formed by adding a suitable color of dye or pigment into an organic compound which performs physicochemical bonding with metal. Representative examples of organic compounds performing physicochemical bonding with metal may include benzotriazole, alkylimidazole and benzimidazole, in which alkylimidazole is preferable since it readily volatilizes at high temperature.

For reference benzotriazole, alkylimidazole and benzimidazole have the following chemical structures:

Benzotriazole:

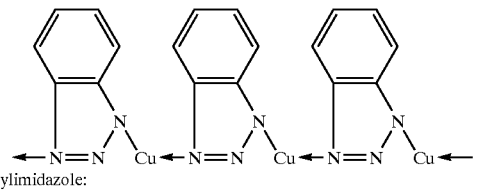

Alkylimidazole:

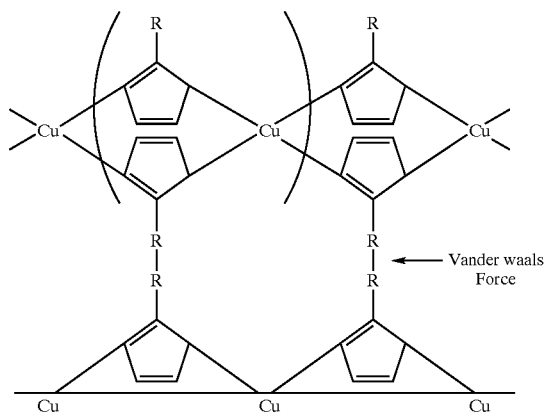

Benzimidazole:

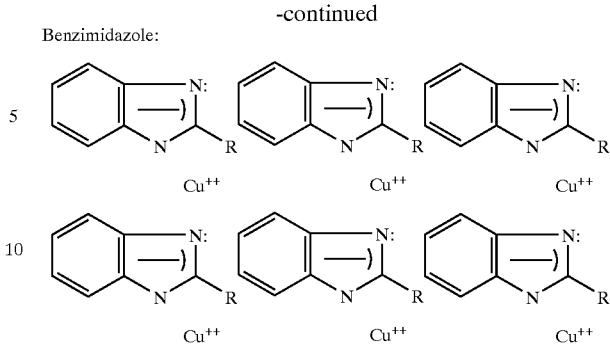

Figure 3A:
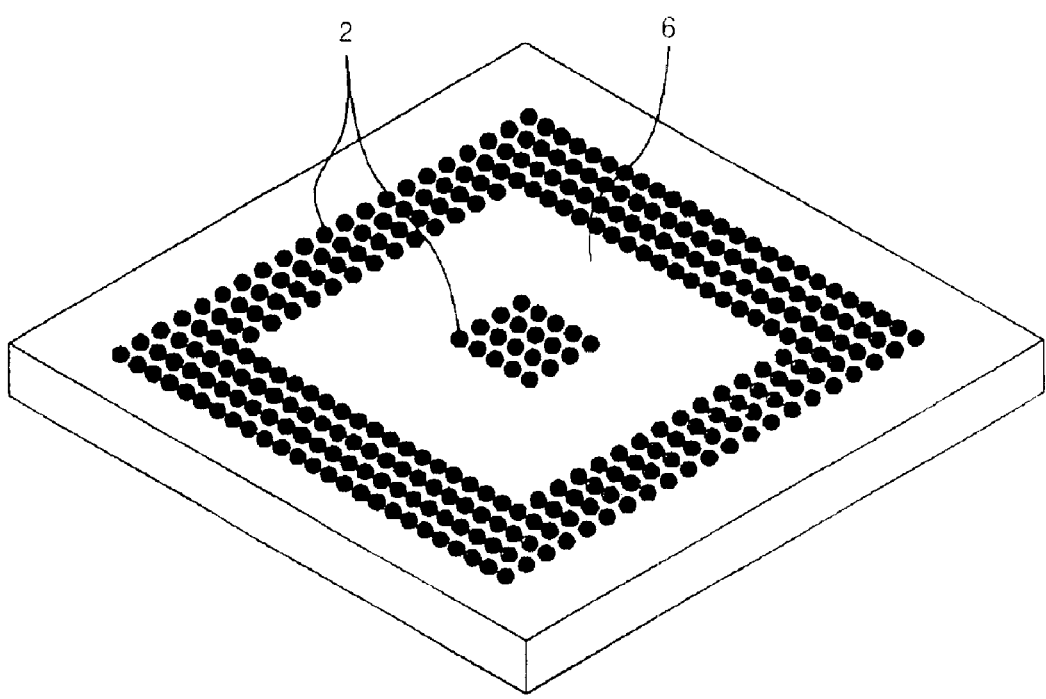
FIG. 3A is a perspective view of solder balls of the present invention placed on a semiconductor package substrate before reflow process.
Figure 3B:
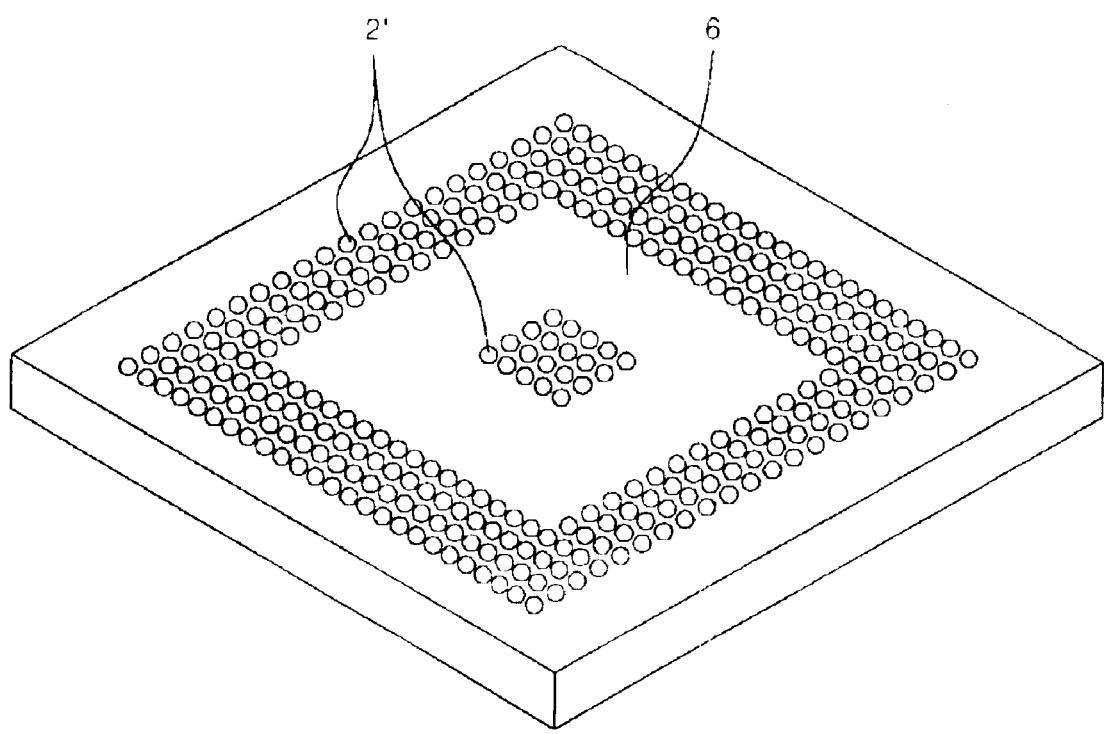
FIG. 3B is a perspective view of solder balls of the present invention fused to a semiconductor package substrate, which are volatilized in color after reflow process.

Referring to FIG. 3A, a perspective view of solder balls of the present invention which are placed on a semiconductor package substrate before reflow process is illustrated, and referring to FIG. 3B, a perspective view of the solder balls of the present invention fused to a semiconductor package substrate, which are volitalized in color after reflow process is illustrated.

As shown in the drawings, colorant formed by mixing organic compound with dye or pigment is completely removed owing to volatilization at a high temperature atmosphere during the reflow process of the solder balls 2. That is, the solder balls 2 have a predetermined color when they are bumped on a substrate 6 via flux (before reflow process) as shown in FIG. 3A. However, colorant is completely removed from the surface of the solder balls 2', as shown in FIG. 3B, when the solder balls 2' completely adhere to the substrate 6 via reflow process. Then, the solder balls 2' return to their original color.

Of course, the solder balls 2 are variously colored according to their types such as size and metallic composition. Therefore, solder balls can be readily discriminated according to their sizes and metallic compositions since different solder balls are differently colored. For example, lead-free solder balls may be colored blue so that they can be readily discriminated from common gray solder balls made of Sn and Pb. Furthermore, the solder balls are coated with colorant before reflow process in order to prevent oxidation of the solder balls owing to exposure to the air.

Table 1 also reports results of a shear stress test after the conventional solder balls and the colored solder balls of the present invention are reflow-soldered or fused to substrates.

TABLE 1

|  | Conventional Solder Ball | (unit:gf) Colored Solder Ball |
|---|---|---|
| Mean | 1880.2 | 1879.7 |
| Max | 2336 | 2304 |
| Min | 1595 | 1591 |
| Standard Deviation | 125.0 | 138.7 |
| Index of Process Capability | 2.35 | 2.11 |

As reported in Table 1, the conventional solder balls and the solder balls of the present invention do not show a significant difference in mean shear stress values. The conventional solder balls have a mean shear stress of about 1880.2 while the solder balls of the present invention have a mean shear stress of about 1879.7. There is also no significant difference in Index of Process Capability ($C_{pk}$). The conventional solder balls have Index of Process Capability of about 2.35 while the solder balls of the present invention have Index of Process Capability of about 2.11. Therefore, it is understood that the colored solder balls of the present invention can readily pass the shear stress test after reflow process.

Although not shown in the FIGS. 3A and 3B, as colorant formed by mixing organic compound with dye or pigment is completely volatilized and removed, a predetermined area of the conductive wires of the present invention (for example, the entire area of the conductive wires placed on a heating block), to which high temperature is applied during bonding, returns to its original color. Colorant is also removed from both of a ball-forming and bonding area for first bonding and a stitch bonding area for second bonding at a high temperature atmosphere so that colorant does not have any influence on the bonding force of the conductive wires to the semiconductor die and the substrate. That is, since colorant is completely removed through volatilization from those high temperature areas (i.e., the bonding areas), degradation of the bonding force due to colorant will not occur in the bonding areas.

Of course, the conductive wires are differently colored according to their types such as diameter and metallic composition, thereby allowing the conductive wires to be readily discriminated. Coloration also can prevent oxidation of the conductive wires due to exposure to the air before wire bonding.

Accordingly, the colored solder balls and the colored conductive wires of the present invention could be discriminated with ease.

Figure 4:
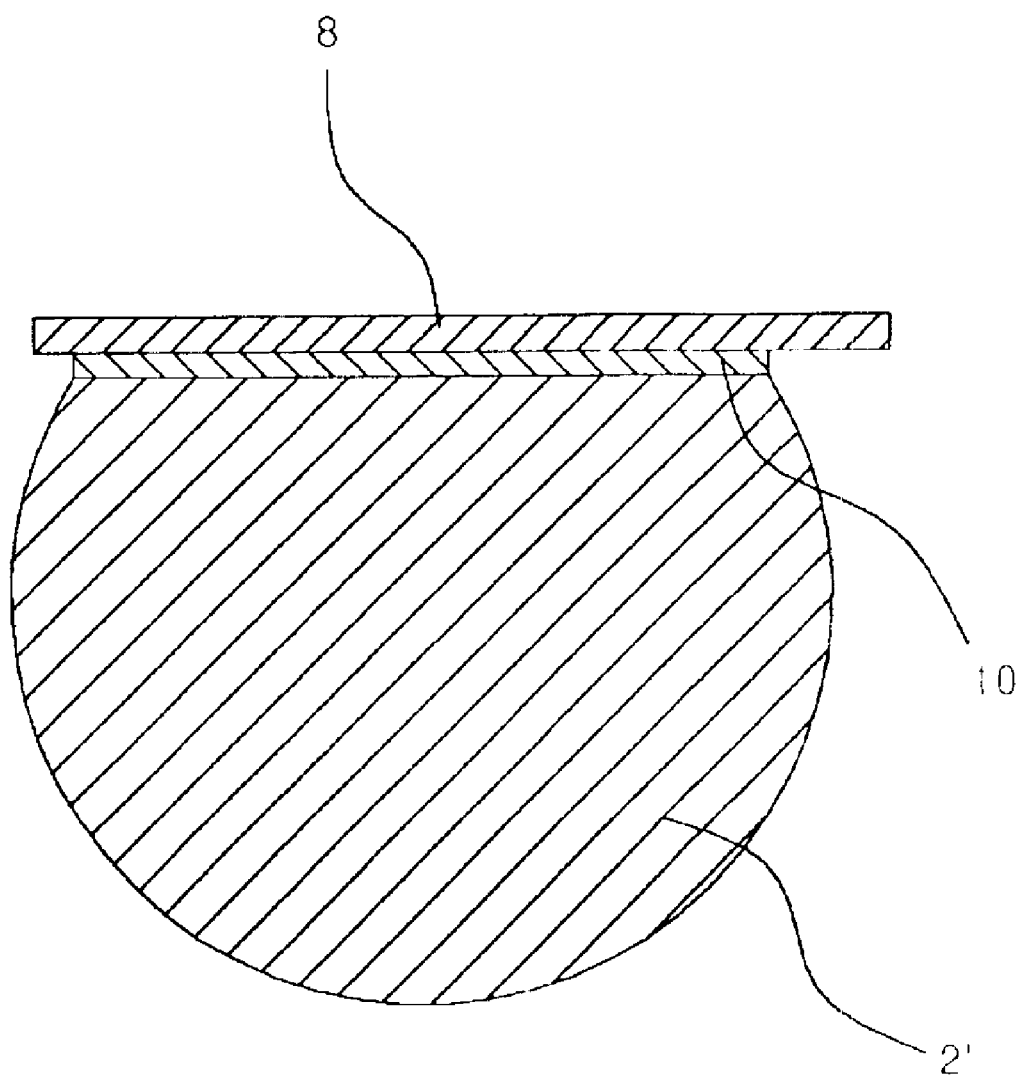
FIG. 4 is a sectional view of a solder ball of the present invention after reflow process.

Referring to FIG. 4, a sectional view of a solder ball of the present invention after reflow process is illustrated.

As shown in the drawing, no voids are confirmatively formed within the solder ball 2' of the present invention after reflow process. Even though the solder ball 2' is colored, it is understood that the solder ball 2' is not inferior in its quality to a conventional solder ball. In FIG. 4, the reference number 8 indicates a copper pattern, and reference number 10 indicates an interface between the copper pattern 8 and the solder ball 2'.

Figure 5:
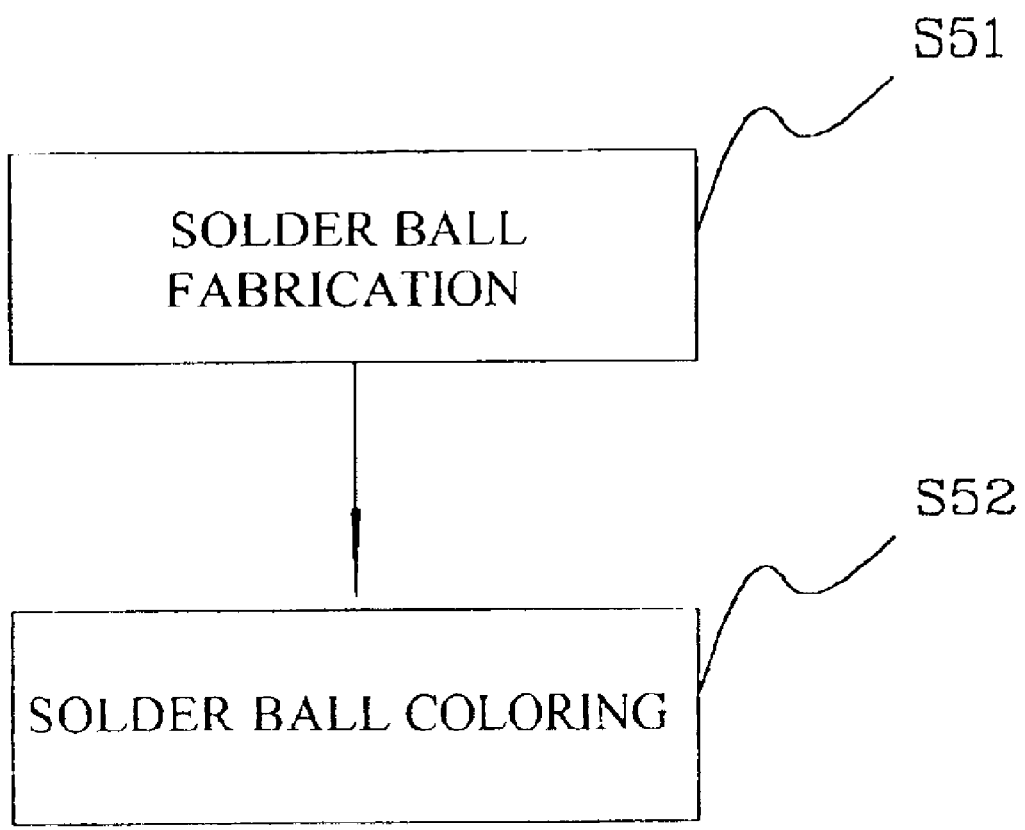
FIG. 5 is a flow chart showing one manufacturing method of solder balls of the present invention.

Referring to FIG. 5, a flow chart showing one manufacturing method of solder balls of the present invention is illustrated.

As shown in drawing, the solder ball fabricating process of the present invention includes a primary solder ball fabricating step S51 and a coloring step S52.

In the primary solder ball fabricating step S51, substantially global solder balls are fabricated by melting and cooling Sn and Pb or Sn only.

In the coloring step S52, the substantially global solder balls are immersed into a colorant solution, which contains organic compound and dye mixed into organic compound, at a temperature of about 25 to 50° C. for about 1 to 5 minutes. The immersed solder balls are taken out of the colorant solution and then dried so that the surfaces of the solder balls are dyed with a predetermined color.

Of course, the coloring step is carried out with different colors according to the type of the solder balls such as size and metallic composition so that the solder balls can be discriminated at first sight according to their types.

Moreover, colorant is formed by adding a suitable color of dye or pigment into the organic compound which performs physicochemical bonding with metal. Representative examples of organic compounds performing physicochemical bonding with metal may include benzotriazole, alkylimidazole and benzimidazole, in which alkylimidazole is preferable since it readily volatilizes at high temperature.

Figure 6:
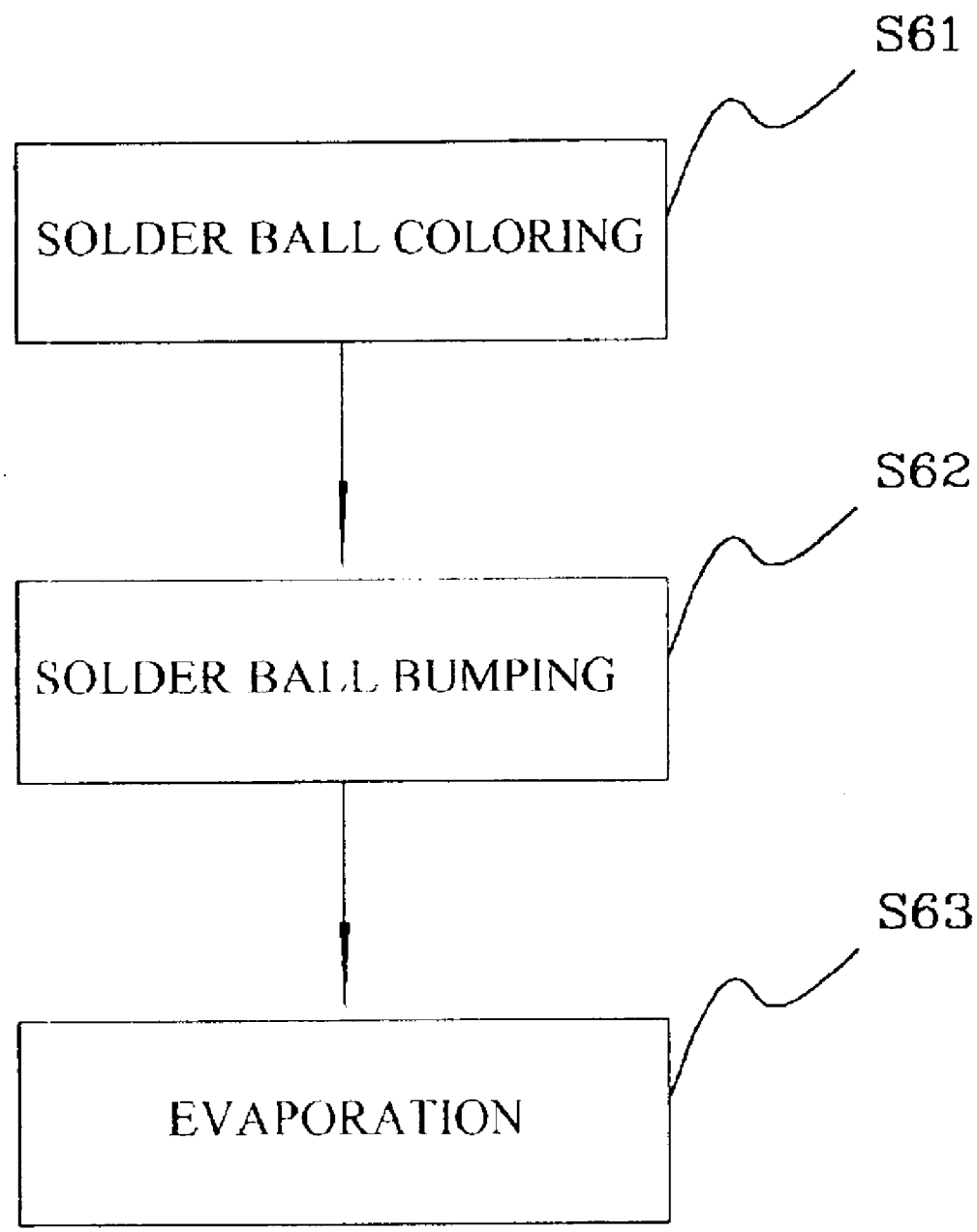
FIG. 6 is a flow chart showing one evaporation method of solder balls of the present invention.

Referring to FIG. 6, a flow chart showing one evaporation method of solder balls of the present invention is illustrated.

As shown in drawing, the solder ball evaporating process of the present invention includes a solder ball coloring step S61, a solder ball bumping step S62 and an evaporating step S63.

In the solder ball coloring step S61, colorant is applied to the surface of the substantially global solder balls. That is, colorant containing organic compound mixed with a predetermined color of dye or pigment is coated on the surface of the solder balls. Of course, colorant is formed by adding a suitable color of dye or pigment into organic compound performing physicochemical bonding with metal.

In the solder ball bumping step S62, the solder balls are temporarily fixed to a substrate via flux bumping.

Then, in the evaporation step S63, the substrate having the solder balls bumped thereto is inputted into a furnace at a temperature of about 150 to 260° C. and reflowed for about 30 to 60 seconds so that colorant is completely evaporated from the surface of the solder balls.

This evaporation step prevents colorant from obstructing electrical connection between the solder balls and the substrate or between the solder balls and external devices.

Figure 7:
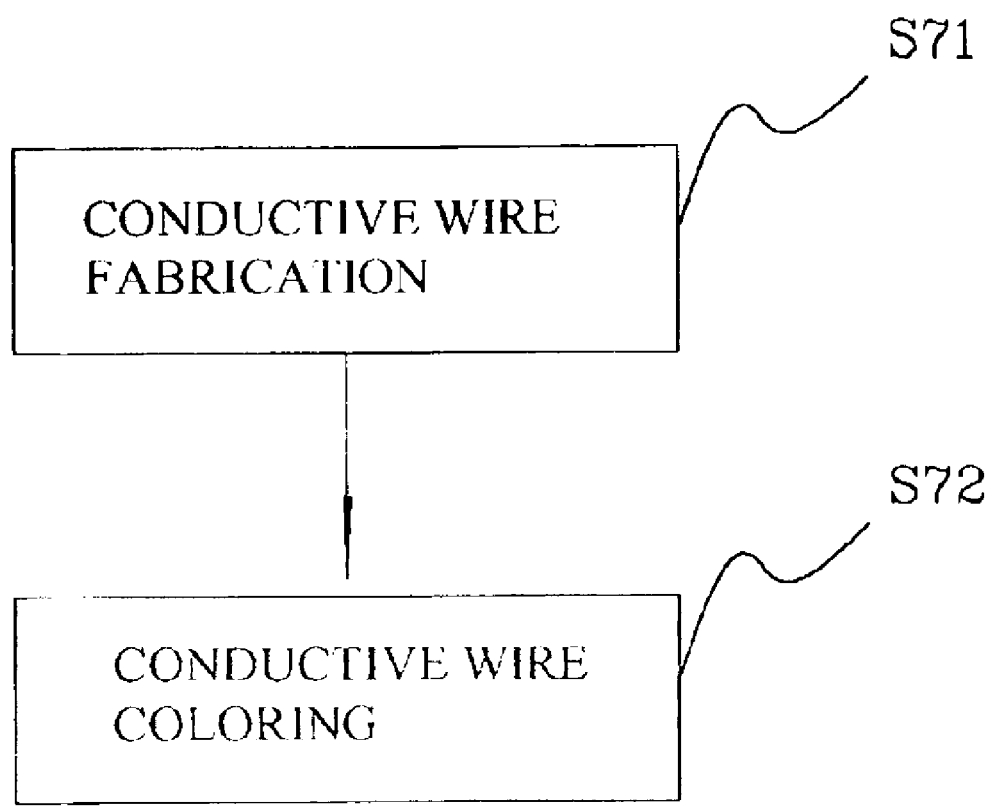
FIG. 7 is a flow chart showing one manufacturing method of a conductive wire of the present invention.

Referring to FIG. 7, a flow chart showing one manufacturing method of a conductive wire of the present invention is illustrated.

As shown in drawing, the conductive wire fabricating process of the present includes a conductive wire fabricating step S71 and a coloring step S72.

In the conductive wire fabricating step S71, a predetermined diameter of conductive wire is refined from metal such as Au, Al and Cu and drew from the refined metal.

Then, in the coloring step S72, the conductive wire is immersed into a colorant solution containing mixture of organic compound and dye or pigment at a temperature of about 25 to 50° C. for about 1 to 5 minutes between heat process and winding process. The immersed conductive wire is pulled out of the colorant solution and dried so that the conductive wire is dyed with a predetermined color. Of course, colorant is formed by adding a suitable color of dye or pigment into organic compound which performs physicochemical bonding with metal.

Of course, the coloring step is carried out with different colors according to the type of the conductive wire such as diameter and metallic composition so that the conductive wire can be discriminated at first sight according to its type.

Figure 8:
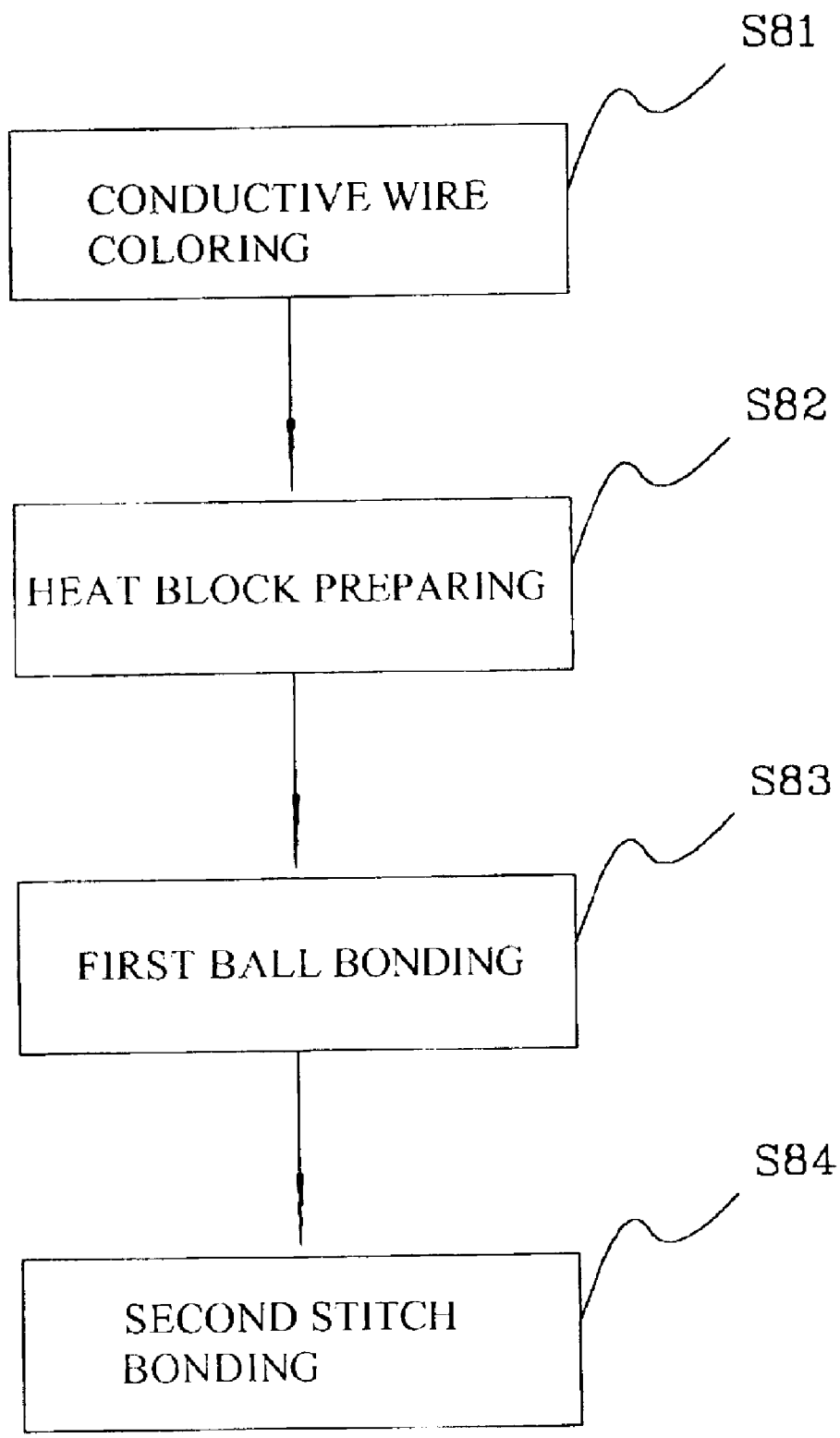
FIG. 8 is a flow chart showing one evaporation method of a conductive wire of the present invention.

Referring to FIG. 8, a flow chart showing one evaporation method of a conductive wire of the present invention is illustrated.

As shown in drawing, the conductive wire evaporating process of the present invention includes a conductive wire coloring step S81, a heat block preparing step S82, a first ball bonding step S83 and a second stitch bonding step S84.

In the conductive wire coloring step S81, the surface of the conductive wire is applied by colorant as described above. That is, colorant containing organic compound mixed with a predetermined color of dye or pigment is coated on the surface of the conductive wire. Of course, the colorant is formed by adding a suitable color of dye or pigment into organic compound which performs physicochemical bonding with metal.

In the heat block preparing step S82, wire bonding between a semiconductor die and a substrate is carried out on a heat block at a temperature of about 180 to 275° C. to evaporate colorant from the wire. That is, the wire is directly exposed to an atmosphere of 180 to 275° C. during the wire bonding step so that colorant is evaporated from the whole wire.

In the first ball bonding step S83, heat of high temperature is produced via electric energy and applied to one end of the wire for the purpose of first ball bonding of the wire so that colorant can be evaporated from the one end of the wire. Since colorant is completely evaporated, first ball bonding of the wire is performed to the semiconductor die without degradation of bonding force resulting from colorant.

Then, in the second stitch bonding step S84, frictional heat via a supersonic wave is applied to the other end of the wire for the purpose of second stitch bonding of the wire so that colorant can be evaporated from the other end of the wire. Since colorant is completely evaporated, second stitch bonding of the wire is performed to the substrate without degradation of bonding force owing to colorant.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

We claim:

1. A solder ball for a semiconductor package, which is coupled to a substrate via flux and reflow process, wherein a surface of the solder ball is colored by a colorant containing organic compound and dye according to at least one of size and metal composition.

2. The solder ball of claim 1, wherein the organic compound is selected from a group consisting of: benzotriazole, alkylimidazole, benzimidazole, and combinations thereof.

3. A contact for a semiconductor package, comprising a metallic component, wherein an outer surface of the metallic component is colored by a colorant.

4. The contact of claim 3, wherein the colorant physicochemically bonds to the metallic component.

5. The contact of claim 3, wherein the colorant comprises an organic compound and a dye.

6. The contact of claim 3, wherein the organic compound is selected from a group consisting of: benzotriazole, alkylimidazole, benzimidazole, and combinations thereof.

7. The contact of claim 3, wherein the outer surface of the metallic component is differently colored according to size and metal composition.

8. The contact of claim 3, wherein the colorant volatilizes at a high temperature.

9. A contact for a semiconductor package comprising a metallic component, wherein an outer surface of the metallic component is colored by a colorant according to size and metal composition, the colorant physicochemically bonds to the metallic component and volatilizes during a reflow process.

10. The contact of claim 9, wherein the colorant comprises an organic compound and a dye.

11. The contact of claim 9, wherein the organic compound is selected from a group consisting of: benzotriazole, alkylimidazole, benzimidazole, and combinations thereof.

12. A contact for a semiconductor package, comprising a metallic component, wherein an outer surface of the metallic component is coated by means for coloring the outer surface.

13. The contact of claim 12, wherein the means physicochemically bonds to the metallic component.

14. The contact of claim 12, wherein the means comprises an organic compound and a dye.

15. The contact of claim 12, wherein the outer surface of the metallic component is differently coated by the means according to size and metal composition.

16. The contact of claim 12, wherein the means volatilizes at a high temperature.

* * * * *